United States Patent
Rand et al.

(10) Patent No.: US 8,987,749 B2
(45) Date of Patent: Mar. 24, 2015

(54) LIGHT EMITTING DIODE AND METHOD FOR FABRICATING THE SAME

(71) Applicant: IMEC, Leuven (BE)

(72) Inventors: Barry Rand, Leuven (BE); Celso Cavaco, Leuven (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 13/918,581

(22) Filed: Jun. 14, 2013

(65) Prior Publication Data

US 2014/0001483 A1 Jan. 2, 2014

(30) Foreign Application Priority Data

Jun. 15, 2012 (EP) .................................... 12172215

(51) Int. Cl.
| | | |
|---|---|---|
| *H01L 29/15* | (2006.01) | |
| *H01L 33/40* | (2010.01) | |
| *H01L 33/42* | (2010.01) | |
| *H01L 33/00* | (2010.01) | |
| *H01L 33/22* | (2010.01) | |

(52) U.S. Cl.
CPC .............. *H01L 33/405* (2013.01); *H01L 33/42* (2013.01); *H01L 33/0079* (2013.01); *H01L 33/22* (2013.01); *H01L 2933/0016* (2013.01)
USPC ................... 257/76; 257/80; 257/87; 257/94; 257/98; 257/99

(58) Field of Classification Search
CPC ..... H01L 31/143; H01L 31/162; H01L 33/00; H01L 51/20
See application file for complete search history.

(56) References Cited

U.S. PATENT DOCUMENTS

| | | | |
|---|---|---|---|
| 3,804,672 A | 4/1974 | Dey | |
| 7,115,915 B2 * | 10/2006 | Shei et al. | ........................ 257/98 |
| 2003/0178629 A1 * | 9/2003 | Yagi | ................................ 257/87 |
| 2005/0179046 A1 | 8/2005 | Oh et al. | |

(Continued)

FOREIGN PATENT DOCUMENTS

| | | |
|---|---|---|
| JP | 2006-140234 A | 6/2006 |
| JP | 2009-534830 A | 9/2009 |

(Continued)

OTHER PUBLICATIONS

Extended European Search Report issued Oct. 11, 2012 for EP Application No. 12172215.1.

(Continued)

*Primary Examiner* — Kyoung Lee
(74) *Attorney, Agent, or Firm* — Knobbe, Martens, Olson & Bear LLP

(57) ABSTRACT

The disclosed technology relates to a light-emitting diode (LED) and a method of fabricating the same. In one aspect, the LED includes a GaN p-n junction formed at a junction between a p-type GaN layer and an n-type GaN layer. The LED further includes a first metal electrode layer provided on the p-type GaN layer, where the first metal electrode layer is configured to reflect light emitted by the p-n junction towards a light emitting side of the LED. The LED additionally includes an attachment layer interposed between and configured to electrically connect the p-type GaN layer and the metal electrode layer, wherein the attachment layer comprises a transition metal oxide and is configured to transmit light emitted by the p-n junction and to transmit light reflected by the metal electrode layer.

10 Claims, 4 Drawing Sheets

(56) References Cited

U.S. PATENT DOCUMENTS

| | | |
|---|---|---|
| 2006/0157695 A1 | 7/2006 | Katoda |
| 2007/0158661 A1* | 7/2007 | Lu et al. .................... 257/79 |
| 2009/0134418 A1 | 5/2009 | Lee |
| 2009/0243475 A1 | 10/2009 | Shoda et al. |
| 2009/0243478 A1 | 10/2009 | Shoda et al. |
| 2010/0102450 A1 | 4/2010 | Narayan |
| 2011/0095271 A1 | 4/2011 | Bradley et al. |
| 2011/0210363 A1 | 9/2011 | Lee |

FOREIGN PATENT DOCUMENTS

| | | |
|---|---|---|
| WO | WO 2007/027035 A1 | 3/2007 |
| WO | WO 2007/120016 A1 | 10/2007 |

OTHER PUBLICATIONS

Jeong et al., "Suppression of Ag Agglomeration on Pt-capped ITO/Ag Reflectors for Vertical-type Light-Emitting Diodes," Journal of the Korean Physical Society, vol. 55, No. 4, pp. 1615-1620, 2009.

\* cited by examiner

LIGHT EMITTING DIODE AND METHOD FOR FABRICATING THE SAME

CROSS-REFERENCE TO RELATED APPLICATIONS

This application claims priority under 35 U.S.C. §119(a)-(d) to a European patent application No. EP 12172215.1 filed on Jun. 15, 2012, the disclosure of which is hereby incorporated by reference in its entirety.

BACKGROUND OF THE INVENTION

1. Field of the Invention

The disclosed technology relates generally to a light emitting diode (LED), and more particularly to an LED having a GaN p-n junction and improved photon yield.

2. Description of the Related Technology

Some light emitting diodes (LEDs) having a GaN p-n junction are fabricated by providing a silver metal electrode layer on the p-type GaN layer of the GaN p-n junction. The metal electrode layer electrode is electrically attached to the p-type GaN layer and is often configured to reflect light emitted by the p-n junction. Many such LEDs include an attachment layer in the form of a transparent conductive oxide layer (e.g., Indium Tin Oxide, or ITO) provided between the p-type GaN layer and the metal electrode layer. Many such LEDs, however, suffer from low photon yield. Thus, there is a need for LEDs having a GaN p-n junction with improved photon yield.

SUMMARY OF CERTAIN INVENTIVE ASPECTS

The disclosed technology relates to a light-emitting diode (LED) and a method of fabricating the same. In one aspect, the LED includes a GaN p-n junction formed at a junction between a p-type GaN layer and an n-type GaN layer. The LED further includes a first metal electrode layer provided on the p-type GaN layer, where the first metal electrode layer configured to reflect light emitted by the p-n junction towards a light emitting side of the LED. The LED additionally includes an attachment layer interposed between and configured to electrically connect the p-type GaN layer and the metal electrode layer, wherein the attachment layer comprises transition metal oxide and is configured to transmit light emitted by the p-n junction and to transmit light reflected by the metal electrode layer.

In another aspect, a method of fabricating a light-emitting diode (LED) includes forming a GaN p-n junction between a p-type GaN layer and an n-type GaN layer. The method additionally includes providing a first metal electrode layer on the p-type GaN layer, where the metal electrode layer configured to reflect light emitted by the p-n junction towards a light emitting side of the LED. The method further includes providing an attachment layer interposed between and configured to electrically connect the p-type GaN layer and the metal electrode layer, wherein the attachment layer comprises transition metal oxide and is configured to transmit light emitted by the p-n junction and to transmit light reflected by the metal electrode layer.

DETAILED DESCRIPTION OF CERTAIN ILLUSTRATIVE EMBODIMENTS

Figure 1A:
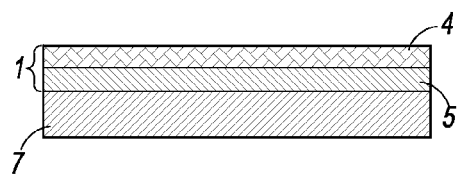
FIGS. 1a-1r illustrate processes included in a method of fabricating an LED according to one embodiment.

Various forms of light emitting diodes having a GaN p-n junction have been known to a person skilled in the art. In some technologies, a GaN p-n junction is formed by a p-type GaN layer and an n-type GaN layer with a silver metal layer electrode is provided on the p-type GaN layer. The metal layer electrode is electrically attached by an attachment layer to the p-type GaN layer. The metal layer electrode is provided to reflect light emitted by the p-n junction. The attachment layer is provided in between both the p-type GaN layer and the silver metal layer electrode and is provided to allow transmittal of light emitted by the p-n junction. The attachment layer thereto is in the form of a transparent conductive oxide layer (ITO).

However, the yield of the light emitted by the LED is often insufficient.

Therefore, it is an objective of the present disclosure to provide an LED offering improved photon yield by using an [0012] [0013] attachment layer comprising a transition metal oxide (TMO).

It has been found that such an attachment layer provides an improved reflection of light emitted by the junction to a light emitting side of the LED resulting in an improved yield of light emitted by the LED.

Experiments have for example shown that by using an attachment layer of molybdenum oxide ($MoO_3$) in combination with a silver (Ag) metal layer electrode, the reflection of light emitted by the junction can substantially remain at 94% for light having a wavelength of 455 nm, which is higher than the 75% measured with ITO as attachment layer for light having a wavelength of 455 nm. Moreover, it has been surprisingly found that the thickness of the molybdenum oxide ($MoO_3$) attachment layer does not even substantially alter the reflection of the light emitted by the combination of the metal layer electrode and the attachment layer within the range of 1 nm-5 nm for the thickness of the attachment layer.

Without wanting to be bound by any theory, the inventor found that the reduction in yield of light emitted by the LED is probably caused by a reduced reflection of the combination of the ITO layer and the metal layer electrode. It has further been found by the inventor that this is probably caused by the ITO having an inferior transmission, possible due to an increased absorbance by the ITO, of the light emitted by the junction.

TMOs, especially molybdenum oxides as $MoO_3$, also have an improved transmission of light at 455 nm with respect to the transmission of ITO, for example a transmission of more than 80% whereas the transmission of light of 455 nm through ITO is only about 75%.

As TMOs, especially molybdenum oxides as $MoO_3$, moreover have an increased workfunction of more than 6 eV, especially for molybdenum oxides such as $MoO_3$, with respect to the workfunction of ITO (approximately 4.6 eV) the contact resistance with the metal layer electrodes decreases further improving the properties of the LED.

Moreover, often transition metals, such as for example molybdenum oxide as $MoO_3$, are more easily available than indium such that the manufacture of LEDs according to the present disclosure becomes easier.

Moreover, the improved results with the LED according to the present disclosure are found to be surprising as the resistivity of TMOs usually is in the range of about $10^2$ Ω.cm to about $10^{10}$ Ω.cm whereas the resistivity of ITO is in the range of $10^{-5}$ Ω.cm to about $10^{-3}$ Ω.cm and a good electrical contact between the metal layer electrode and the p-type GaN layer usually is desired.

Although several aspects of TMOs and especially $MoO_3$, such as for example their workfunction, their transmission properties for light at 455 nm and their conductivity are already being described in the prior art, the specific increase of reflection of light of 455 nm in combination with a metal layer electrode as described above and especially the independence of the reflectance of the combination of an attachment layer comprising TMO and a metal layer electrode as described above for light emitted by the p-n junction has not been described in the prior art.

According to embodiments of the disclosed technology, the transition metal oxide comprises at least one of molybdenum oxide, preferably $MoO_3$, tungsten oxide, preferably $WO_3$, vanadium oxide ($V_2O_5$), nickel oxide ($NiO_x$), rhenium oxide ($ReO_3$), Ruthenium oxide ($RuO_2$) and more preferably molybdenum oxide, preferably $MoO_3$. In another embodiment, the transition metal oxide consists essentially of $MoO_3$.

According to embodiments of the disclosed technology, the metal electrode comprises at least one of aluminum (Al), silver (Ag), nickel (Ni), platinum (Pt), iridium (Ir), palladium (Pd), cobalt (Co), cupper (Cu), molybdenum (Mo), chromium (Cr), zinc (Zn), niobium (Nb), tantalum (Ta), titanium (Ti), gold (Au), ruthenium (Ru) and more preferably comprises Ag, most preferably is substantially made of silver (Ag). In another embodiment, the metal consists essentially of silver.

According to other embodiments of the disclosed technology, the metal electrode is substantially made of silver (Ag) and the transition metal oxide comprises $MoO_3$. According to yet other embodiments, the metal electrode consists essentially of silver (Ag) and the transition metal oxide consists essentially of $MoO_3$ According to the disclosed technology, the attachment layer is substantially made of the transition metal oxide or even is made of the transition metal oxide.

According to other embodiments of the disclosed technology, the thickness of the attachment layer is smaller than 50 nm, preferably is 1 nm to 10 nm, more preferably is 1 nm to 5 nm.

According to embodiments according to the present disclosure, the n-type GaN layer extends from below the p-type GaN layer and more preferably a further second electrode layer, for example a metal electrode layer, electrically contacts the n-type GaN layer more preferably at the same side of the p-n junction as the first metal electrode layer contacts the p-type GaN layer as in such configuration the further second electrode layer is positioned at a side of the p-n junction opposing the light emitting side of the LED. In such configuration, the further second electrode layer is not positioned along the p-n junction opposing the first metal electrode layer thereby avoiding the occluding of at least part of the junction and thus decreasing the amount of light emitted by the LED.

According to other embodiments according to the present disclosure, a further second attachment layer is provided in between and adjacent to both the second metal electrode layer and the n-type GaN layer.

The present disclosure also relates to a method for making the LED according to the present disclosure.

According to preferred embodiments of the method according to the present disclosure, on a substrate a GaN p-n junction of a p-type GaN layer and a n-type GaN layer is created with the n-type GaN layer extending from below the p-type GaN layer, with a first metal layer electrode provided along the p-type GaN layer, the first metal layer electrode being electrically conductively attached by a first attachment layer comprising a transition metal oxide to the p-type GaN layer and being provided to reflect light emitted by the p-n junction to a light emitting side of the LED, with the first attachment layer provided in between and adjacent to both the p-type GaN layer and the first metal layer electrode and is provided to allow transmittal of light emitted by the p-n junction, with a second electrode layer, preferably a second metal electrode layer, electrically contacting the n-type GaN layer at the same side of the p-n junction as the first metal electrode layer contacts the p-type GaN layer, after which the substrate is at least substantially removed from below the p-n junction such as to allow transmittal of light from the p-n junction through the light emitting side of the LED.

According to embodiments of the disclosed technology, the substrate is transferred to a side of the LED along the first and the second metal layer electrode opposing the light emitting side of the LED.

According to embodiments of the disclosed technology, the light emitting side of LED is roughened as it has been found that such roughened surface improves the light output at the light emitting side of the LED.

The disclosure will be further elucidated by means of the following description and the appended figures.

Figure 1B:
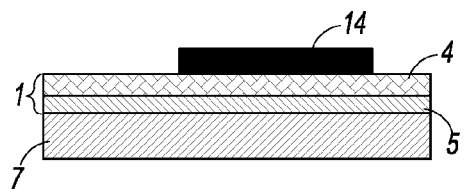
Figure 1C:
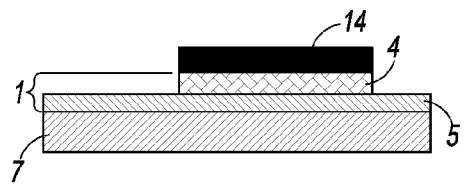
Figure 1D:
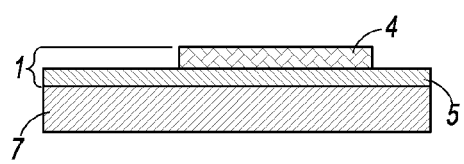
Figure 1E:
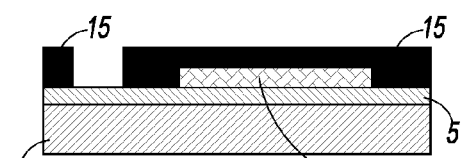
Figure 1F:
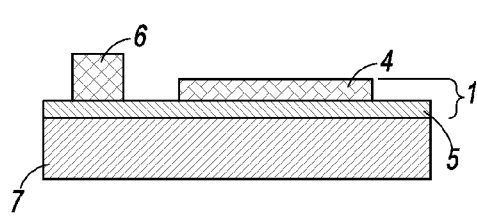
Figure 1G:
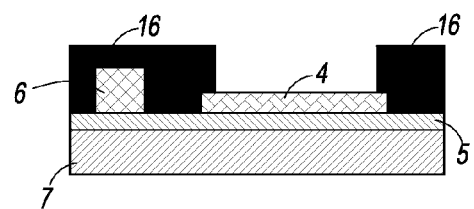
Figure 1H:
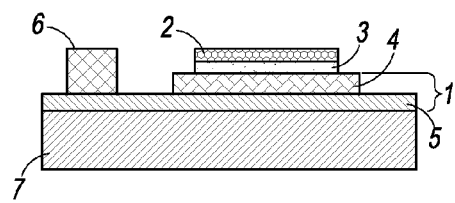
Figure 1I:
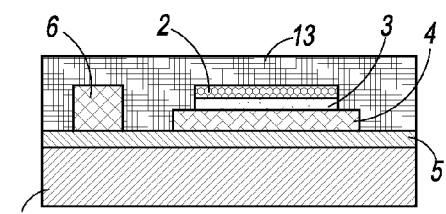
Figure 1J:
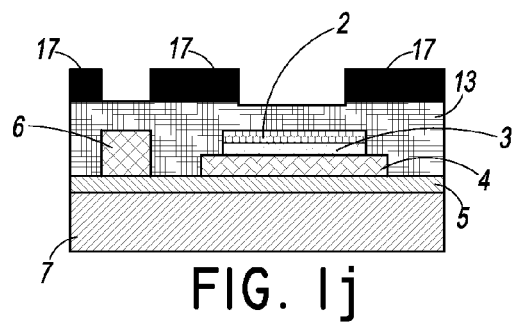
Figure 1K:
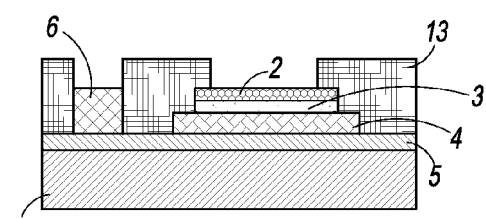
Figure 1L:
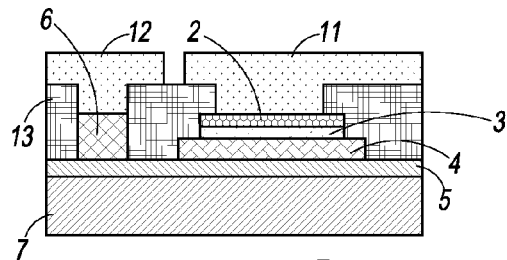
Figure 1M:
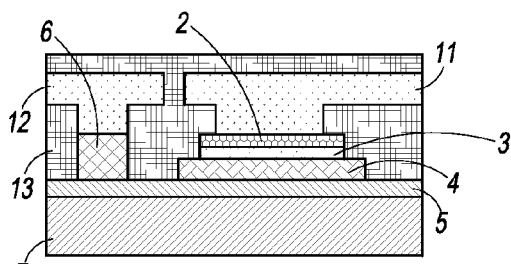
Figure 1N:
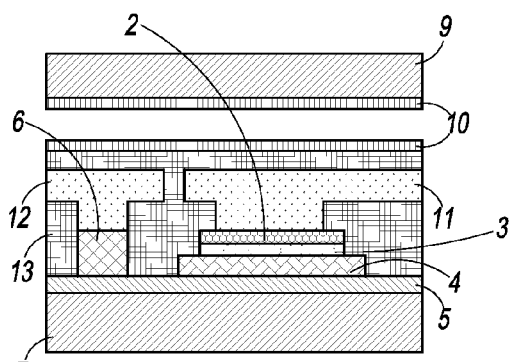
Figure 1O:
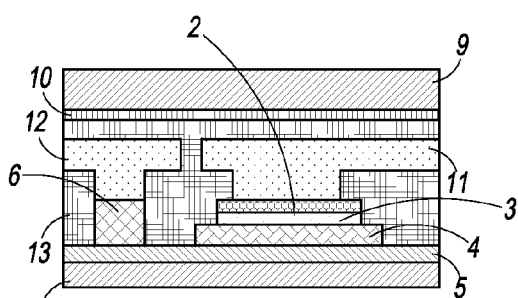
Figure 1P:
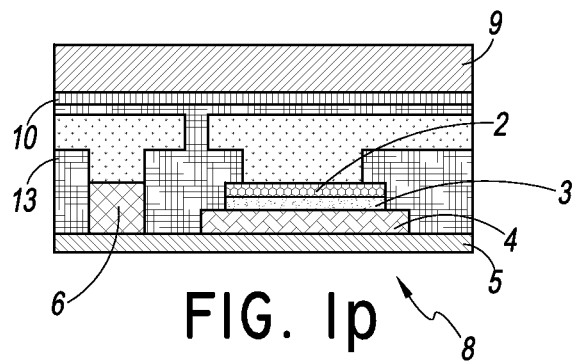
Figure 1Q:
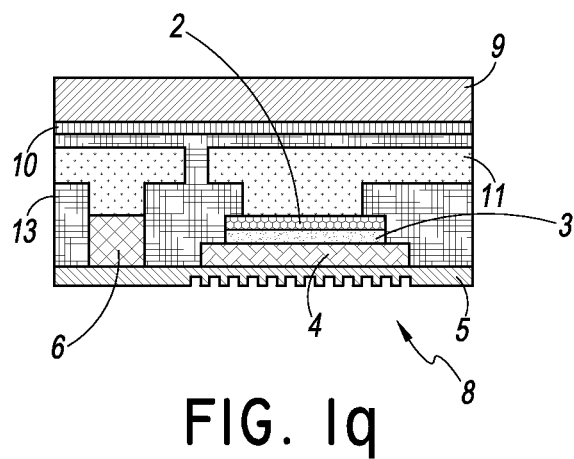
Figure 1R:
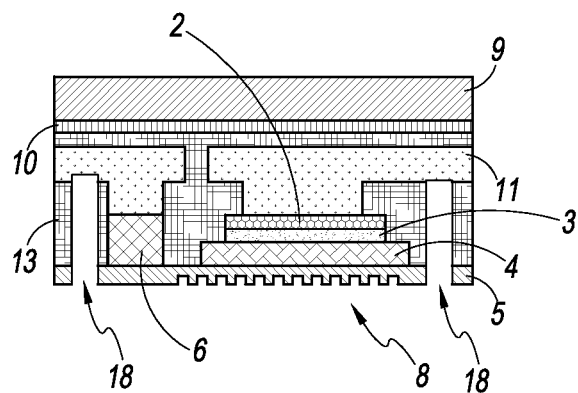

FIGS. 1a-1r illustrate processes included in a method of fabricating an LED according to one embodiment.

In the following detailed description, numerous specific details are set forth in order to provide a thorough understanding of the disclosure and how it may be practiced in particular embodiments. However, it will be understood that the present disclosure may be practiced without these specific details. In other instances, well-known methods, procedures and techniques have not been described in detail, so as not to obscure the present disclosure. While the present disclosure will be described with respect to particular embodiments and with reference to certain drawings, the disclosure is not limited hereto. The drawings included and described herein are schematic and are not limiting the scope of the disclosure. It is also noted that in the drawings, the size of some elements may be exaggerated and, therefore, not drawn to scale for illustrative purposes.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

FIGS. 1a-1r illustrate processes included in a method of fabricating an LED according to one embodiment.

The figures show how on a substrate 7, e.g. a Si substrate, a GaN p-n junction 1 of a p-type GaN layer 4 and a n-type GaN layer 5 is created with the n-type GaN layer 5 extending from below the p-type GaN layer 4, with a first metal layer electrode 2 provided along the p-type GaN layer 4, the first metal layer electrode 2 being electrically conductively attached by a first attachment layer 3 comprising a transition metal oxide to the p-type GaN layer 4 and being provided to reflect light emitted by the p-n junction 1 to a light emitting side 8 of the LED, with the first attachment layer 3 provided in between and adjacent to both the p-type GaN layer 4 and the first metal layer electrode 2 and is provided to allow transmittal of light emitted by the p-n junction 1, with a second electrode layer 6, e.g. a second metal electrode layer 6, electrically contacting the n-type GaN layer 5 at the same side of the p-n junction 1 as the first metal electrode layer 2 contacts the p-type GaN layer 4, after which the substrate 7 is at least substantially removed from below the p-n junction 1 such as to allow transmittal of light from the p-n junction 1 through the light emitting side 8 of the LED.

In FIG. 1a on a substrate 7, e.g. a Si substrate, a GaN p-n junction 1 of a p-type GaN layer 4 and an n-type GaN layer 5 has been created. As can be noted the p-type layer 4 is positioned on top of the n-type layer 5. Such a GaN p-n junction 1 is for example grown by metal-organic chemical vapor deposition (MOCVD). This is however not critical for the disclosure and any type of application method, deemed appropriate by the person skilled in the art, can be used.

In one embodiment, magnesium dopants are used. This is however not critical for the invention and any type of dopant deemed appropriate by the person skilled in the art can be used. For example, the dopants are activated with a 750° C. anneal in $N_2$ for 10 minutes.

In FIG. 1b-1d a preferred embodiment is shown wherein a resist 14 is applied to the p-type layer 4 of the p-n junction 1. Subsequently part of the p-n junction 1 layers are removed next to the resist 14, thereby exposing the n-type layer of the junction 1 not covered by the resist 14. The result is shown in FIG. 1c and is such that the n-type GaN layer 5 extends from below the p-type GaN layer 4. Subsequently the resist 14 is removed such as to uncover the p-type layer 4 of the junction 1 again, as shown in FIG. 1d.

FIG. 1e-1f show a preferred embodiment for applying the second metal layer electrode 6 wherein subsequently to FIG. 1d a resist 15 is applied over the p-n junction 1 in FIG. 1e such that an opening is left out for the second metal layer electrode 16 and that subsequently, as shown in FIG. 1f, the resist 15 is removed such that the second, e.g. a metal, electrode 6 is left. Although the second metal electrode 6 can be directly applied to the n-type layer 5, it is possible that a further second attachment layer is provided in between and adjacent to both the second metal electrode layer and the n-type GaN layer 5. Thereto, for example, prior to applying the second metal electrode 6 the second attachment layer is applied to the n-type layer 5.

FIGS. 1g-1h show a preferred embodiment for applying the first metal electrode 2 and the attachment layer 3 wherein subsequently to FIG. 1f a resist 16 is applied over the p-n junction 1 in FIG. 1g such that an opening is left out for the attachment layer 3 and there over the first metal layer electrode 2 and that subsequently, as shown in FIG. 1h, the resist 16 is removed such that the first metal electrode 2 is left with the attachment layer 3 beneath it. As one of the preferred materials for the attachment layer 3 $MoO_3$, is water soluble, removing the resist 16, when the attachment layer 3 comprises $MoO_3$ or other water soluble materials, does not require water.

FIGS. 1i-1n show further steps before removing the substrate 7 at least substantially from below the p-n junction 1 such as to allow transmittal of light from the p-n junction 1 through the light emitting side 8 of the LED.

FIG. 1i shows that an oxide 13, for example $SiO_2$, is applied over the p-n junction 1 and the first 2 and second 6 metal electrodes such as to improve, for example electrical, isolation of the LED from the environment.

FIGS. 1j-1m show an embodiment to fabricate electrical contacts 11, 12 with the first 2 and the second 6 metal electrodes. More in particular FIG. 1j shows the application of a resist 17 before removing part of the oxide 13 such that openings are created, as shown in FIG. 1k, for applying the electrical contacts 11, 12 as shown in FIG. 1l. Finally in FIG. 1m, the step of again covering the resulting structure with oxide, e.g. $SiO_2$, is shown. The electrical contacts 11, 12 for example comprises TiW/Au/TiW, although not critical for the invention and can also comprise conductive metals, etc.

FIG. 1n shows that a second carrier 9, for example a Si carrier, is applied to the top of the LED, for example the LED as shown in FIG. 1m. In this example, a bonding material 10 is being used for binding the second carrier 9 to the LED, for example the LED of FIG. 1m. The bonding material 10 for example is applied to both the top of the LED and the bottom of the second carrier 9 facing the LED. The bonding material 10 for example comprises or even is a TiW (12 nm)/Au (170 nm)/In (8000 nm) layer. Subsequently the second carrier 9 and the LED are for example bonded to each other using a so-called FC6 (flip chip) Karl Suss bonder.

FIG. 1o shows the resulting LED. FIGS. 1o and 1p show the removal of the first initial substrate 7 such that the substrate 7 is transferred to a side of the LED along the first and the second metal layer electrode 2, 6 opposing the light emitting side 8 of the LED. FIG. 1o shows the step of polishing the first substrate 7 to a certain depth using for example chemical mechanical polishing (CMP), although other techniques are also possible, after for example having glued to obtained LED to a glass carrier plate. The substrate 7 for example is thinned down from 1.15 mm to 100 μm using for example a slurry based on $Al_2O_3$ with particles of about 20 μm diameter, although other techniques, for example CMP techniques, are also possible. Subsequently, the final removal of the first substrate 7 is done using for example an etching technique, for example a SF6 dry etch technique and a wet etching technique more based on (3:4:5) ($HF:HNO_3:CH_3COOH$) as it has been found to be more efficient, although other techniques are possible. However, the step shown in FIG. 1o can be omitted and the entire initial first substrate 7 can be removed with, for example a single technique, such as for example, etching.

In FIG. 1q it is shown that the light emitting side 8 of LED is roughened, for example using an etching technique, for example wet-etching, for example based on KOH, although other techniques are possible, such as for example a dry etching technique, for example based on $Cl_2$.

In FIG. 1r it is shown that pad-openings 18 are created towards the electrical contacts 11, 12 for electrically connecting the LED to further electrical contacts. The pad-openings 18 can be created using techniques such as for example etching, such as for example dry etching, for example based on $Cl_2$, although other techniques can also be used.

Application of layers on top of previous layers, such as for example the application of the first metal layer electrode 2, the second metal layer electrode 6, the attachment layer 3, the electrical contacts 11, 12, the bonding material 10, etc. any type of method can be used such as for example physical vapor deposition, solution based techniques (sol-gel, nanoparticles), sputter deposition, pulsed laser deposition, electron beam deposition, physical vapor deposition, chemical vapor deposition, atomic layer deposition, etc. Alternatively, the attachment layer 3 can for example be created by applying a transition metal layer on top of the p-type layer 4 and subsequently oxidizing the transition metal layer such as to create a TMO layer, i.e. the attachment layer 3.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention.

What is claimed is:

1. A light-emitting diode (LED), comprising:
   a p-n junction formed at a junction between a p-type GaN layer and an n-type GaN layer, wherein the n-type GaN layer is formed between a substrate and the p-type GaN layer;
   a first metal electrode layer provided on the p-type GaN layer, the first metal electrode layer configured to reflect light emitted by the p-n junction towards a light-emitting side of the LED;
   a first attachment layer interposed between and configured to electrically connect the p-type GaN layer and the first metal electrode layer, wherein the attachment layer comprises a transition metal oxide and is configured to transmit light emitted by the p-n junction and to transmit light reflected by the first metal electrode layer;
   a second metal electrode layer electrically contacting the n-type GaN layer on the same side of the p-n junction as a side of the p-n junction on which the first metal electrode layer contacts the p-type GaN layer, and
   a second attachment layer interposed between and in contact with the second metal electrode layer and the n-type GaN layer.

2. The LED of claim 1, wherein the transition metal oxide comprises at least one of molybdenum oxide, tungsten oxide, vanadium oxide, nickel oxide, rhenium oxide, ruthenium oxide and molybdenum oxide.

3. The LED of claim 1, wherein the first metal electrode layer comprises at least one of aluminum (Al), silver (Ag), nickel (Ni), platinum (Pt), iridium (Ir), palladium (Pd), cobalt (Co), cupper (Cu), molybdenum (Mo), chromium (Cr), zinc (Zn), niobium (Nb); tantalum (Ta), titanium (Ti), gold (Au), and ruthenium (Ru).

4. The LED of claim 1, wherein the thickness of the first attachment layer is less than about 50 nm.

5. The LED of claim 4, wherein the thickness of the first attachment layer is between about 1 nm and 10 nm.

6. The LED of claim 1, wherein the metal electrode layer comprises silver (Ag).

7. A method of fabricating a light-emitting diode (LED), comprising:
   forming a p-n junction at a junction between a p-type GaN layer and an n-type GaN layer, wherein the p-n junction is formed on a substrate and the n-type GaN layer is formed between the p-type GaN layer and the substrate;
   forming a first metal electrode layer on the p-type GaN layer, the first metal electrode layer configured to reflect light emitted by the p-n junction towards a light-emitting side of the LED; and
   forming an attachment layer interposed between and configured to electrically connect the p-type GaN layer and the first metal electrode layer, wherein the attachment layer comprises a transition metal oxide and is configured to transmit light emitted by the p-n junction and to transmit light reflected by the first metal electrode layer;
   forming a second metal electrode layer electrically contacting the n-type GaN layer on the same side of the p-n junction as a side of the p-n junction on which the first metal electrode layer contacts the p-type GaN layer; and
   removing at least part of the substrate from below the p-n junction, such that the LED is configured to transmit light from the p-n junction through the light emitting side of the LED.

8. The method of claim 7, wherein the substrate is transferred to a side of the LED opposing the light emitting side of the LED.

9. The method of claim 7, wherein the light emitting side of the LED is roughened.

10. A light-emitting diode (LED), comprising:
    a p-n junction formed at a junction between a p-type GaN layer and an n-type GaN layer;
    a metal electrode layer provided on the p-type GaN layer, the metal electrode layer configured to reflect light emitted by the p-n junction towards a light emitting side of the LED; and
    an attachment layer interposed between and configured to electrically connect the GaN layer and the metal electrode layer,
    wherein the attachment layer comprises a transition metal oxide comprising molybdenum oxide ($MoO_3$) and is configured to transmit light emitted by the p-n junction and to transmit light reflected by the metal electrode layer.

* * * * *

UNITED STATES PATENT AND TRADEMARK OFFICE
CERTIFICATE OF CORRECTION

PATENT NO. : 8,987,749 B2  
APPLICATION NO. : 13/918581  
DATED : March 24, 2015  
INVENTOR(S) : Barry Rand Page 1 of 1

It is certified that error appears in the above-identified patent and that said Letters Patent is hereby corrected as shown below:

In the specification

In column 3 at line 35, Change "$MoO_3$" to --$MoO_3$.--.

In the claims

In column 7 at line 44, In Claim 1, change "layer, and" to --layer; and--.

In column 8 at line 2, In Claim 3, change "(Nb);" to --(Nb),--.

In column 8 at line 46, In Claim 10, change "the GaN" to --the p-type GaN--.

Signed and Sealed this  
Fifth Day of January, 2016

Michelle K. Lee  
*Director of the United States Patent and Trademark Office*